US006671636B2

(12) United States Patent
Dawson

(10) Patent No.: US 6,671,636 B2
(45) Date of Patent: Dec. 30, 2003

(54) APPARATUS, METHOD AND ARTICLE OF MANUFACTURE FOR UTILITY MONITORING

(75) Inventor: William A. Dawson, Gwinn, MI (US)

(73) Assignee: Utility Collection Systems, LLC, Greeley, CO (US)

( * ) Notice: Subject to any disclaimer, the term of this patent is extended or adjusted under 35 U.S.C. 154(b) by 194 days.

(21) Appl. No.: 09/817,589

(22) Filed: Mar. 26, 2001

(65) Prior Publication Data

US 2002/0062198 A1 May 23, 2002

Related U.S. Application Data

(60) Provisional application No. 60/252,245, filed on Nov. 20, 2000.

(51) Int. Cl.[7] .......................... G06F 19/00; G01R 11/56
(52) U.S. Cl. .................. 702/62; 705/412; 340/870.02; 379/106.03
(58) Field of Search ..................... 702/62, 61; 705/412; 340/870.02, 870.03; 379/106.03

(56) References Cited

U.S. PATENT DOCUMENTS

| 4,218,737 | A | 8/1980 | Buscher et al. ............. 364/493 |
| 4,315,251 | A | 2/1982 | Robinson et al. ........... 340/310 |
| 4,388,690 | A | 6/1983 | Lamsden .................... 364/483 |
| 4,614,945 | A | 9/1986 | Brunius et al. ......... 340/870.03 |
| 4,811,011 | A | 3/1989 | Sollinger ............... 340/870.02 |
| 4,866,761 | A | 9/1989 | Thornborough et al. .... 379/107 |
| 4,940,976 | A | 7/1990 | Gastouniotis et al. .. 340/870.02 |
| 5,056,107 | A | 10/1991 | Johnson et al. ................ 375/1 |
| 5,128,988 | A | 7/1992 | Cowell et al. .............. 379/107 |
| 5,134,650 | A | 7/1992 | Blackmon .................... 379/107 |
| 5,252,967 | A | 10/1993 | Brennan et al. ........ 340/870.02 |
| 5,438,329 | A | 8/1995 | Gastouniotis et al. .. 340/870.02 |
| 5,469,365 | A | 11/1995 | Diekema et al. ............. 364/483 |
| 5,491,473 | A | 2/1996 | Gilbert .................. 340/870.01 |
| 5,553,094 | A | 9/1996 | Johnson et al. .............. 375/200 |
| 5,590,179 | A | 12/1996 | Shincovich et al. ........ 379/107 |
| 5,719,564 | A | 2/1998 | Sears ..................... 340/870.02 |
| 5,726,646 | A | 3/1998 | Bane et al. ............. 340/870.03 |
| 5,731,765 | A | 3/1998 | Allison et al. ......... 340/870.03 |
| 5,737,363 | A | 4/1998 | Dinkins ....................... 375/219 |
| 5,748,104 | A | 5/1998 | Argyroudis et al. ... 340/870.11 |
| 5,852,409 | A | 12/1998 | Bell ....................... 340/870.02 |
| 5,856,791 | A | 1/1999 | Gray et al. ............. 340/870.02 |
| 5,874,903 | A | 2/1999 | Shuey et al. ........... 340/870.02 |
| 2001/0024165 | A1 | * 9/2001 | Steen et al. ............ 340/870.01 |
| 2002/0039068 | A1 | * 4/2002 | Holowick .............. 340/870.02 |
| 2002/0054619 | A1 | * 5/2002 | Haas .......................... 375/133 |

* cited by examiner

Primary Examiner—Patrick Assouad
(74) Attorney, Agent, or Firm—Townsend and Townsend and Crew LLP; William F. Vobach

(57) ABSTRACT

A utility data collection system can be implemented utilizing a serial sequence of transmissions between subsequent utility monitors. Each utility monitor can add its local utility data with the data of preceding utility monitors and transmit the combined set of data to the next utility monitor in the serial sequence. In an alternative embodiment of the invention, low power transmitters can be utilized at each utility monitor in the field to transmit to proximate utility monitors such that high power transmitters are not required to communicate directly with the utility center. Furthermore, the detection of anomalies can be tracked and immediately conveyed to the utility centers from each utility monitor. Components of the utility collection system can be implemented as code, methods and apparatus.

11 Claims, 11 Drawing Sheets

APPARATUS, METHOD AND ARTICLE OF MANUFACTURE FOR UTILITY MONITORING

This invention relates generally to the field of monitoring utility systems. More specifically, this invention relates to transmitting data from individual utility sites to a utility center.

BACKGROUND

The gathering of utility information in the past has been a manual procedure in which meter readers typically visit the sites where meters are located so as to gather the usage information. This is a time consuming task that results in large expense to the utility companies which is passed on to the utility customers. Attempts have been made in the past to semi-automate this procedure; however, often these attempts have failed to produce adequate results.

Furthermore, at a household, for instance, more than one utility usage meter often exists. The electric company has a meter for electricity usage. The gas company has a meter for gas usage. The water company has a meter for water usage. Other utilities could have similar meters as well. Each company uses its own meter readers to visit the site in order to gather information about that respective company's utility service. Therefore, the effort in gathering information is repeated by each company.

Other attempts at gathering utility information have often involved the use of expensive or high-powered transmission equipment. The cost of this equipment essentially prohibits its use throughout a residential or large utility usage area. Therefore a large utility usage area, such as a residential area, is still left without an efficient means for gathering the utility data. Furthermore, some equipment requires a level of power sufficient to transmit utility usage information a significant distance such that the utility information can be gathered by centralized equipment. Again, this leads to a great expense for the equipment.

The use of transmitters in utility gathering has often involved the use of high-powered transmitters to transmit data. The use of a high-powered transmitter requires that it be approved by the FCC, as the FCC regulates the transmissions that are above a threshold level of power. Thus, the use of such equipment requires governmental approval which can be quite complicated, expensive, and burdensome.

Hence, there is a need for a system that will permit an easy means for gathering utility information.

SUMMARY

The present embodiments of the invention provide a system for overcoming some of the obstacles presented by existing utility networks. In one form, the present invention comprises a method for collecting utility data made up of more than one utility usage sites by providing a utility monitor located at a first usage site; receiving data from a second utility monitor located at a second utility usage site; combining the data from the second utility monitor with the data from the first utility monitor so as to form a combined set of data; and transmitting the combined set of data to a data collection device.

In another embodiment of the invention a method and apparatus is provided for collecting utility data by providing a plurality of utility monitors, wherein each of the utility monitors is located at a utility usage site; serially transmitting data between each of the plurality of utility monitors so as to create a combined set of data for the utility monitors; and transmitting the combined set of data to a utility data collection device.

In yet another embodiment of the invention a system is provided which comprises providing a plurality of utility monitors; transmitting at a low power level data for each utility monitor to a proximate utility monitor; creating a combined set of data for all of the utility monitors; and transmitting the combined set of data at a high-power level to the utility data collection device. The various embodiments of the invention have features which are interchangeable. For example, in the embodiment where information is transmitted at low power, the information also can be transmitted in a serial fashion between the plurality of utility monitors in a daisy chain fashion.

The utility data collection device can utilize a high-power transmitter, such as a cellular transmitter, to communicate directly with the utility center which processes data for all of the utility system. Similarly, the utility collection device can also communicate with utility monitors having a high-power transceiver.

One embodiment of the invention allows for the processing of error information. The individual utility monitors can gather error information and transmit it through the chain of neighboring utility monitors or directly to the utility data collection device or utility center. Similarly, the communication network can allow for the order of a serial chain of utility monitors to be altered from data gathering session to data gather session. In this way, individual utility monitors can be removed from the data gathering process. Additionally, a more efficient order of utility monitors can be implemented so as to accomplish more error free transmission of data.

The present invention will be more clearly understood from the detailed description below in conjunction with the accompanying drawings.

DESCRIPTION

Figure 1:
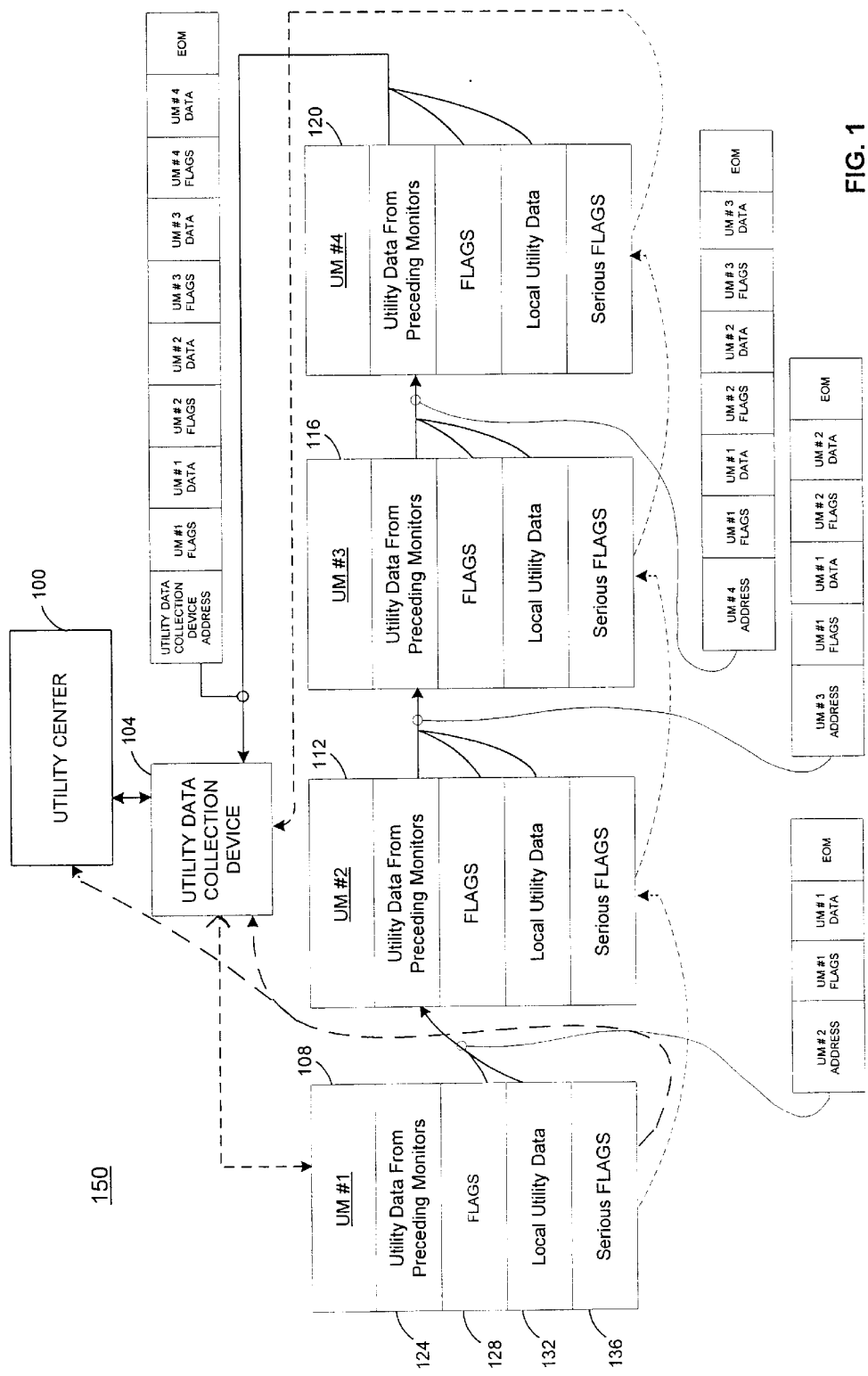
FIG. 1 illustrates a system of several utility monitors and the transmission of data from the first utility monitor to the utility center.

Referring now to the figures, and more particularly to FIG. 1, a system for implementing an embodiment of the invention is shown as system 150. As can be seen in FIG. 1 the utility data gathering system is comprised of a utility center 100, a main monitor 104, a utility data collection device, such as main monitor 104, and a plurality of utility monitors such as UM#1, UM#2, UM#3, UM#4, which are illustrated as 108, 112, 116, and 120, respectively.

The utility center 100 is considered to be the main utility data gathering point for the utility system. For example, a power company's main billing system or maintenance system could serve as the utility center for that type of system. The utility data collection device (UDCD) 104 is considered to be a field located data gathering device which receives the data stream of utility information from a plurality of utility monitors mounted at each utility usage site associated with the UDCD. Finally, the utility monitors 108, 112, 116, and 120 are considered to be the field mounted data gathering devices located at each utility usage site, or at least associated with each utility usage site, although it is envisioned that the utility monitor will normally be located near the actual place of utility usage.

Figure 2:
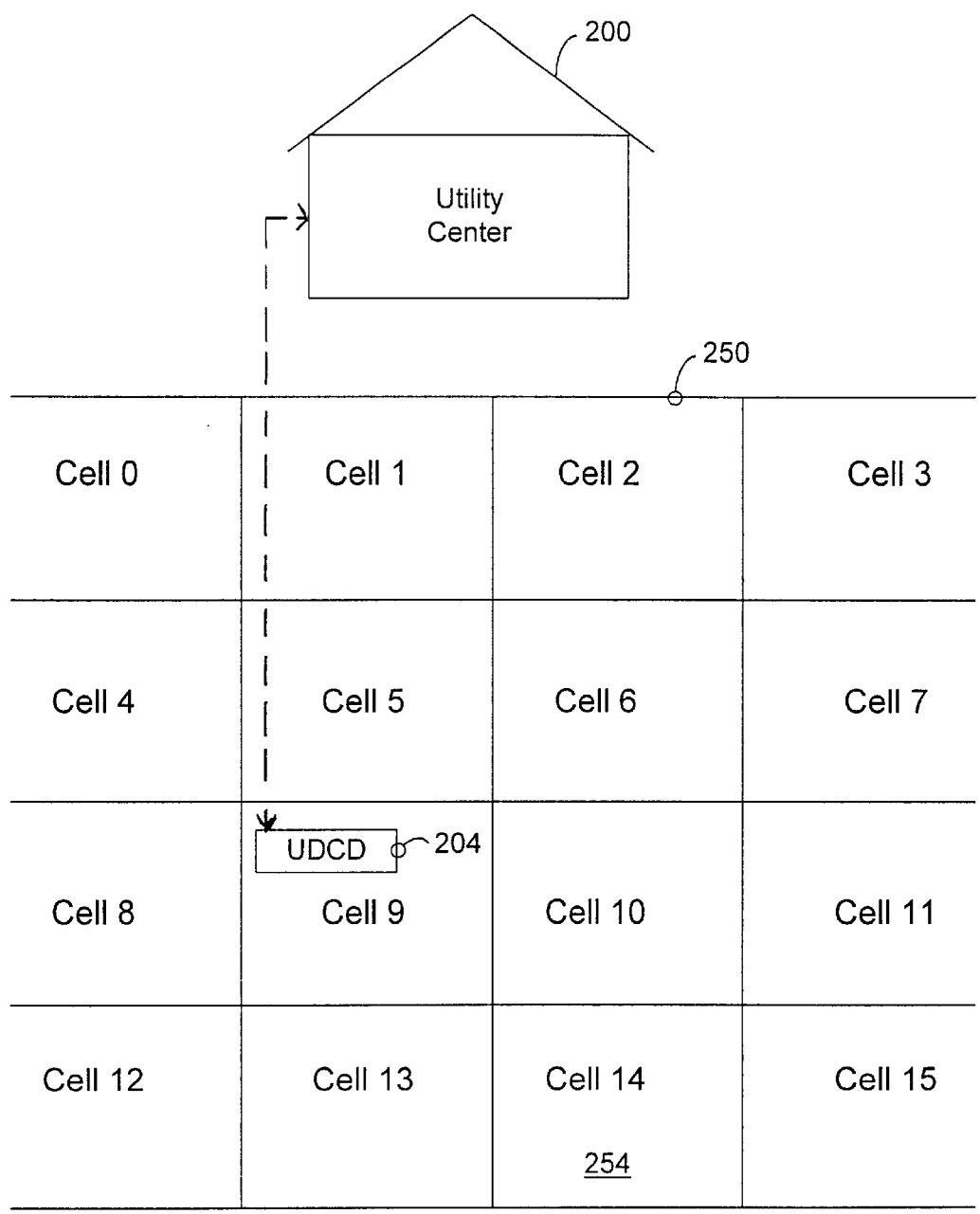
FIG. 2 shows a block diagram illustrating an overview of a utility system divided into a plurality of cells that report to a utility center.

FIG. 2 illustrates an overview of a utility system in which the geographic area of the utility system is divided into "cells." As can be seen in FIG. 2 the illustrated utility system 250 is divided into 16 cells. The utility center 200 is responsible for the 16, in this case, different cells. Thus, this system illustrated as system 250 can be envisioned to cover the entire geographic area for a single city. A utility data collection device (UDCD) 204 is shown located in one of the cells for the utility monitors located in that cell. The dashed line illustrates a transmission of utility data for the cell from UDCD 204 to utility center 200.

Figure 3:
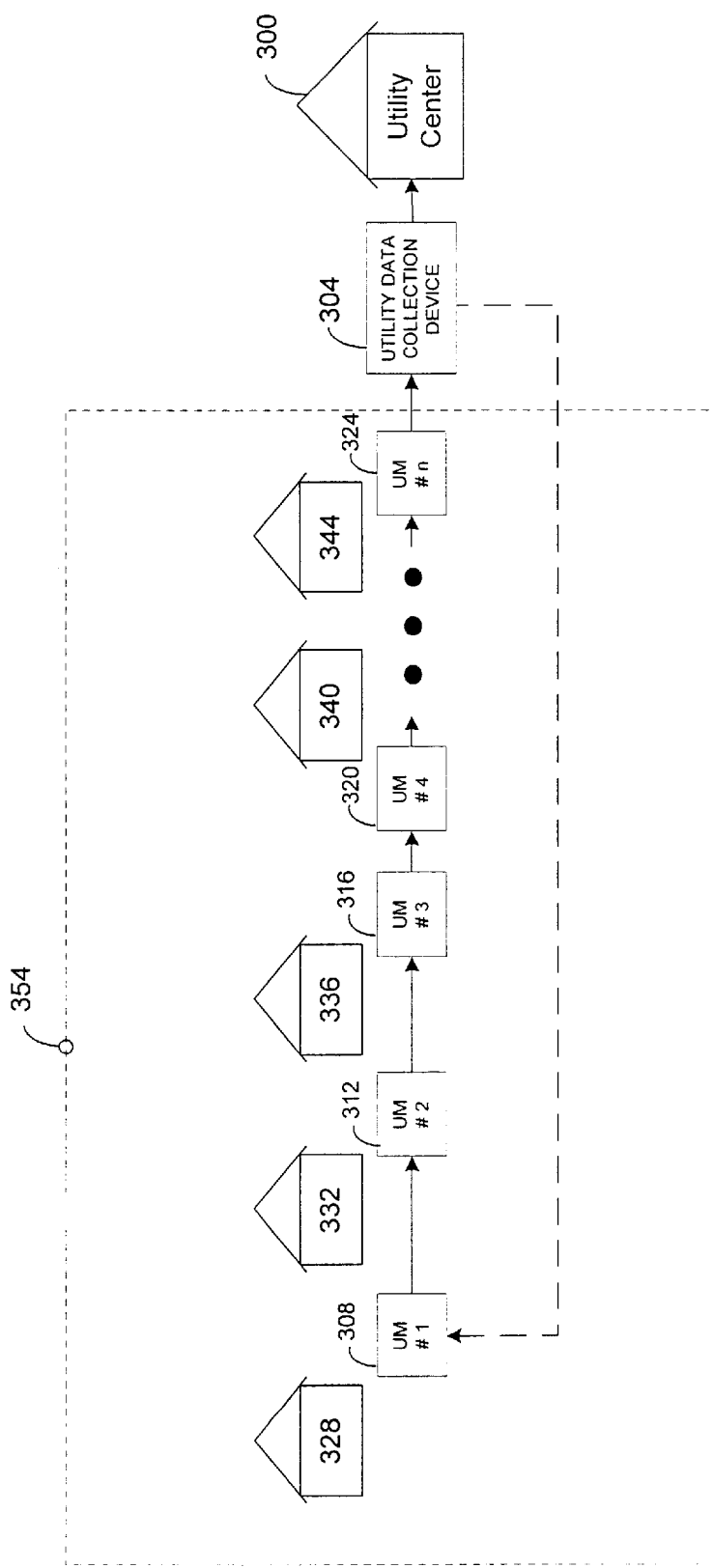
FIG. 3 illustrates an embodiment of the invention in which the utility data gathering process is implemented.

In FIG. 3, a cell 354 is illustrated. As can be seen in FIG. 3, a plurality of utility usage sites, 328, 332, 336, 340, and 344, each have individual utility monitors associated with their sites. For example, utility monitor #1 (308) is associated with site 328. Similarly utility monitor #2 (312) is associated with site 332. Each of the utility monitors is linked in a serial fashion from utility monitor #1 to utility monitor #n (324). The number of utility monitors in a single cell can vary. For example the number could vary from 2 utility monitors to a thousand or more. The output of utility monitor #n (324) is shown coupled to a utility data collection device, such as utility data collection device (UDCD) 304. Similarly the UDCD 304 is coupled to the utility center 300. The UDCD will typically be located within the cell 354.

Figure 4:
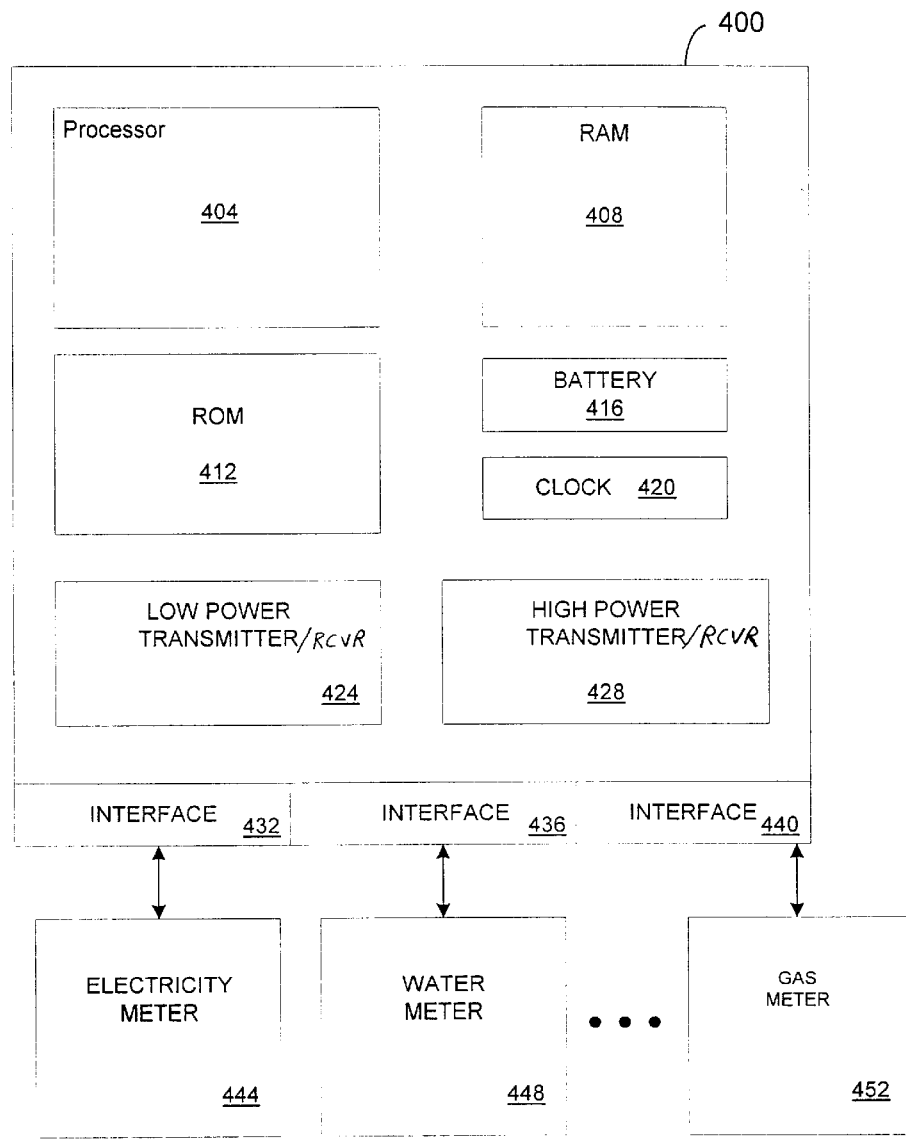
FIG. 4 illustrates an embodiment of the configuration of a utility monitor interfaced with utility meters.

FIG. 4 illustrates an exemplary embodiment of hardware requirements for implementing a utility monitor. For example one could utilize as utility monitor 400 a processor 404, such as a microprocessor, a RAM 408 and a ROM 412. The ROM could be implemented utilizing EEPROM or other types of programmable read only memory (PROM). In addition, a battery 416 is shown along with clock 420. The battery 416 can be used to provide a system backup when normal power to the utility monitor is lost. In this way, data can be stored and gathered during utility anomalies. In addition a low power transmitter 424 is shown along with a high powered transmitter 428. It is envisioned that these two transmitters could be part of a single transmitter having different levels of transmission output. In addition, the low power transmitter 424 is shown as having a receiver. Hence, it could receive low power transmissions as well. Similarly, a receiver is shown as part of the high power transmitter 428; hence, it can be configured to act as a transceiver.

In FIG. 4, an electricity meter 444 along with water meter 448 and gas meter 452 is shown coupled to the utility monitor. Each of these meters can be interfaced through interfaces 432, 436 and 440, respectively. For example, an analog to digital converter can be utilized along with a processor to convert an analog signal from the electricity meter into a digital signal that is capable of being processed by the utility monitor. It is believed that the gathering of the utility information from the variety of monitors and storing the information in the utility monitor would be readily understood by one of ordinary skill in the art. While electricity, water, and gas meters are shown, it is intended that the patent cover alternative types of utilities, as well. Furthermore, it is understood that utility is not limited to a public utility, but rather includes services that are provided to residential customers. Thus this might include, for example, services provided via cable systems.

Returning now to FIG. 1, a system for implementing an embodiment of the invention can be seen. In FIG. 1, the main monitor 104 is responsible for collecting data for all of the utility monitors in its service area and relaying that information to the utility center 100. The utility data collection device (UDCD) 104 initiates the data gathering process through a handshake with the first utility monitor #1. The handshake is illustrated by the dash line between the UDCD and utility monitor #1 (108). This handshake can be initiated by the UDCD transmitting an initiation signal to the utility monitor #1 while the utility monitor #1 is operated in a receiving mode for such a signal. Upon receipt of the initiation signal from the UDCD, utility monitor #1 can transmit its data to the next utility monitor. However, first utility monitor #1 must gather its data for its utility usage site. This data could be gathered either before or after the initiation signal is received. The utility monitor #1 will transduce the input signals from the various meters to which it is coupled and store the representative utility information in its memory, such as a RAM. This information is illustrated in FIG. 1 as block 132 on utility monitor #1. Upon gathering the data information, the utility monitor can note any anomalies in the gathered data. These anomalies can be recorded with various flags and stored in a separate data field 128 as illustrated in FIG. 1.

It is noted that these various flags can represent a wide spectrum of potential errors in the information received from the various meters. In addition, these flags can represent anomalies that are ongoing at the utility usage site. For example, an overvoltage or undervoltage might be noted by the utility monitor and flagged for analysis by the utility center. In addition, a series of what are termed "serious flags" can also be monitored. The utility center can designate what type of anomalies are considered to fall under the "serious" category. If a data flag that is set is of a serious nature, that data can then be transmitted expeditiously to either the UDCD 104 or the utility center 100 or through the chain of other utility monitors. In such a manner, it can be brought to the attention of the utility center in a more expedient manner, as opposed to waiting for a daily collection of data. Anomalies that could be reported, for example, are those such as sustained high levels of use, gas and water leakages, low and high voltage, interruption of service, voltage line surges, lightning strikes and other anomalies that the user or the utility center designates.

Thus, in FIG. 1 utility monitor #1 is considered to be the first utility monitor in the sequence of the data gathering process. Utility monitor #1 stores the address of the utility monitor to which it is required to transmit its data. Thus, having no data from previous utility monitors located in field 124, the utility monitor #1 transmits its local utility data stored in field 132 and any flag information stored in field 128 to the next utility monitor #2. One exemplary format of transmitting this data is indicated in FIG. 1. As can be seen, the address of the utility monitor #2 is appended with the flag information for utility monitor #1 and the data information for utility monitor #1 and an end of message (EOM) indicator to indicate that the data stream is complete. Utility monitor #2 can then receive this transmission.

Utility monitor #2 is set in a receiving mode such that it recognizes its own address indicating that the information is intended for its use. Utility monitor #2 then stores the information from utility monitor #1 and recognizes the end of transmission from the end of message indication. Utility monitor #2 can also detect any potential inaccuracies in the data transmission from utility monitor #1. Thus, if utility monitor #2 suspects that the transmission from utility monitor #1 has been corrupted, then utility monitor #2 can note that fact in its flag field. Thus, the utility center upon receipt of the information can confirm whether or not the potentially corrupted transmission is accurate or not.

Utility monitor #2 repeats the process by combining the received data from utility monitor #1 along with the flag information and a local utility data for utility monitor #2. Such a data stream can be seen in FIG. 1 wherein a header with the address of utility monitor #3 appended to utility monitor #1 flag information and utility monitor #1 data information as well as utility monitor #2 flag information and utility monitor #2 data information is terminated by an end message indicator. This data stream is transmitted to utility monitor #3 116 where it is stored in the utility data from preceding monitor's field as shown in FIG. 1. Again the process repeats itself with utility monitor #3 combining its information with that received from utility monitor #2 and indicating any potential errors in both its gathered local data as well as received data from preceding monitors. Again, the process is repeated with the transmission to utility monitor #4 and the transmission of utility monitor #4's data to the utility data collection device (UDCD) 104 along with the information from the preceding utility monitors. Thus, the result of the process of gathering information from utility monitors 1 through 4 involves a UDCD address followed by utility monitor #1 flag field, utility monitor #1 data field, utility monitor #2 flag field, utility monitor #2 data field, utility monitor #3 flag field, utility monitor #3 data field, utility monitor #4 flag field, utility monitor #4 data field, and the end of message (EOM) indicator.

Thus, the embodiment shown in FIG. 1 utilizes a serial transmission pattern to accomplish relaying the information to the utility data gathering device or UDCD 104. The serial transmission allows a low power transmitter to be utilized by each utility monitor thus, reducing cost and reducing complicated circuitry. Furthermore, the data streams indicate that the organization of the various data fields is accomplished with a first-in-first-out (FIFO) order. Utilizing such a FIFO order, the utility center upon receipt of the utility information can quickly and easily parse the data for each respective customer.

In FIG. 1, upon receipt of the data from the utility monitor #4, UDCD 104 transmits the data to the utility center 100. UDCD 104 can utilize a higher power transmitter to transmit the data stream to the utility center. Thus, this embodiment of the invention allows implementation with a single high power transmitter for a plurality of utility monitor data collection devices. While FIG. 1 illustrates only four utility monitors, it is envisioned that as many at least 1000 utility monitors could be implemented with such a system. In view of the low power nature of the transmitters required, the number of utility monitors would be limited merely by the system hardware capabilities. This embodiment of the invention is thus capable of serially transmitting a significant amount of data while utilizing low power transmitters between individual utility monitors.

FIG. 1. also illustrates how serious flag information can be relayed to the UDCD 104 or the utility center 100. For example in FIG. 1, if a serious condition arises at utility monitor #1 the dashed lines indicate how the utility center or UDCD 104 could be notified of the anomaly. The first option might be to initiate a transmission from the utility monitor #1 across the daisy chain pattern of utility monitor #2, utility monitor #3 and utility monitor #4. Utility monitor #4 would then transmit the data to the UDCD 104 at which point it could also be relayed to utility center 100. It would not be necessary for the UDCD 104 to initiate the process. Rather, if the utility monitor senses a serious anomaly, it can initiate the transmission process itself by transmitting the flag information along with the address of utility monitor #2. Thus, the process is repeated along the daisy chain of utility monitors. Alternatively, utility monitor #1 utilizing a high power transmitter could transmit the data directly to either the UDCD 104 or the utility center 100. Thus, if the utility monitor is equipped with a high power transmitter, such as a cellular-based transmitter, it could communicate the error condition to the utility center or main monitor directly. Thus, the hashed lines indicate such a coupling to the various command and control systems. Should an anomaly arise at one of the other utility monitors, each of the those utility monitors could similarly initiate the transmission of the serious flag to the main monitor or utility center.

Returning again to FIG. 4, one can understand how the utility monitor can store data that it retrieves from either a preceding utility monitor or a utility meter. Thus, in the case of the utility meter, the transduced information can be converted to an appropriate format and stored in the system RAM 408. Similarly, the information received from previous utility monitors can be processed by processor 404 and again stored in RAM 408. Processor 404 can also be programmed to combine the data from preceding utility monitors along with local utility data for a site and conveyed to either low power transmitter 424 or high power transmitter 428. The utility data could be formatted utilizing a digital signal processor to reformat the data to a more compressed size for transmission. It is believed that such manipulation of the data would be readily understood by one of ordinary skill in the art. In addition, should the utility monitor incur a loss of power from the utility service, the battery 416 will facilitate continued operation of the utility monitor such that data can continue to be gathered during the power disturbance.

Figure 5:
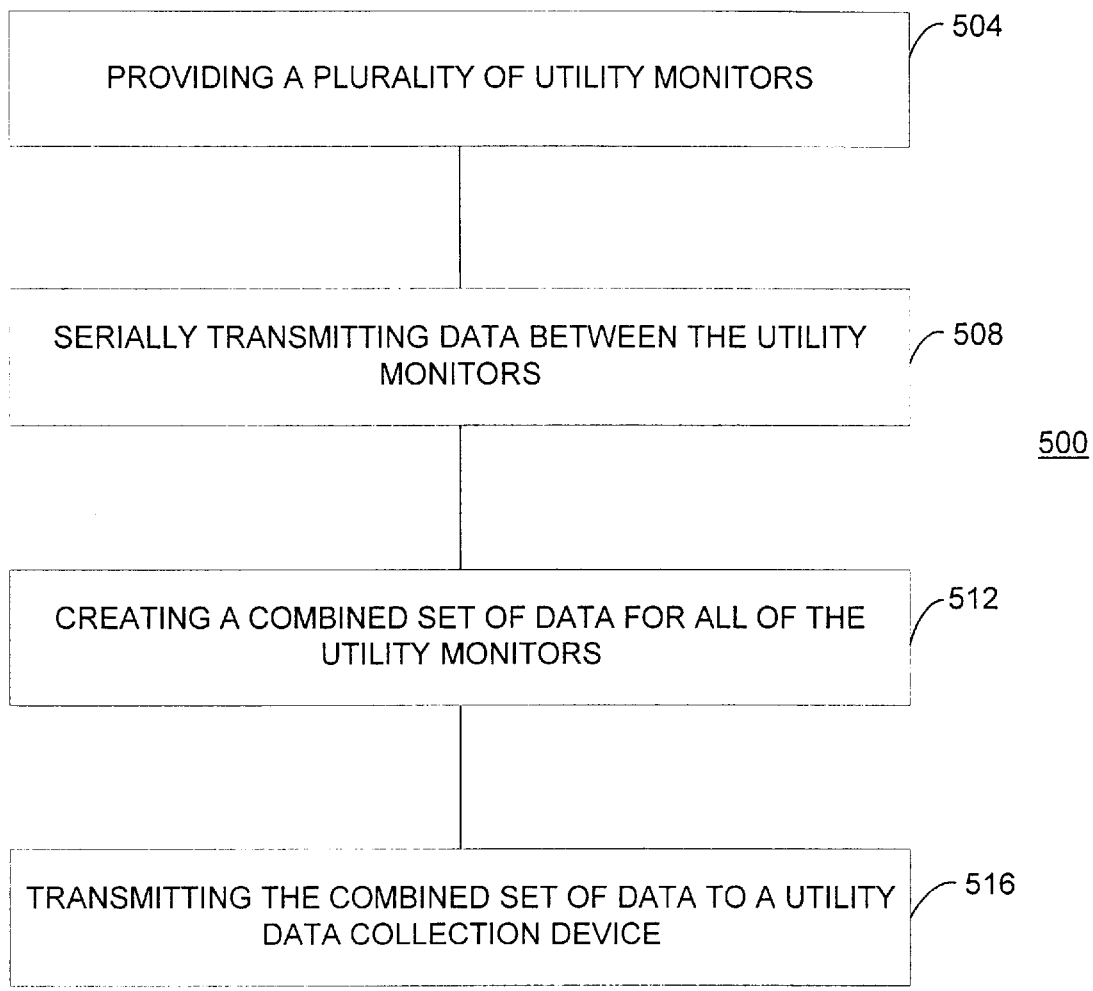
FIG. 5 illustrates a flow chart for an embodiment of the invention in which a method of serially transmitting data is implemented.

Methods of implementing various embodiments of the invention can be seen in FIGS. 5 through 9. FIG. 5 illustrates the serial nature of one embodiment of the invention. FIG. 5 illustrates providing a plurality of utility monitors 504 and serially transmitting data between the utility monitors 508. A combined set of data is created for all of the utility monitors 512 and the combined set of data is transmitted to a utility data collection device 516, such as main monitor 104 in FIG. 1. Thus, the nature of this embodiment of the invention allows a serial transmission of data to be accomplished between utility monitors. Furthermore, a combined set of data is generated which can be passed in a daisy chain fashion from one utility monitor to the next successive utility monitor.

Figure 6:
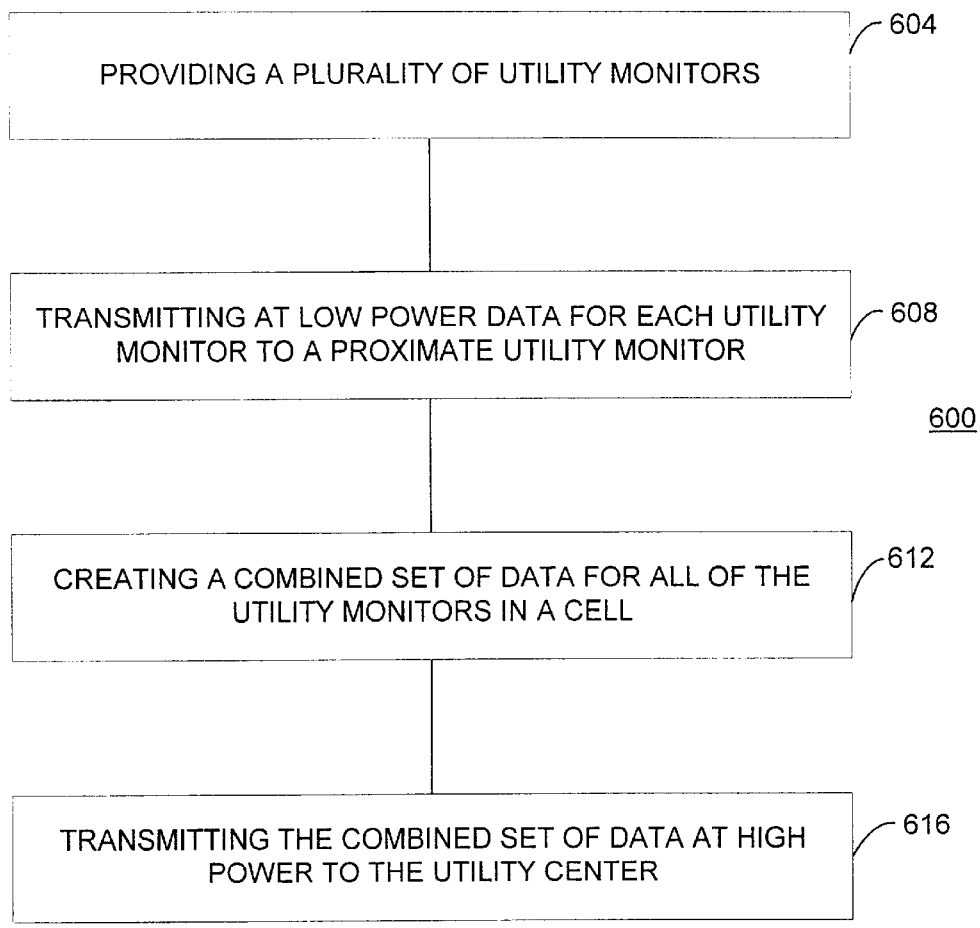
FIG. 6 illustrates a flow chart for another embodiment of the invention in which low power transmissions are utilized to transmit a combined set of data to a utility data collection device.

FIG. 6 illustrates a low power aspect of one embodiment of the invention. In the method of FIG. 6, a plurality of utility monitors is provided 604. The data for each utility monitor is transmitted to a proximate utility monitor at a low power magnitude. Low power is intended to mean a power that is below FCC regulations. Currently, FCC regulations do not regulate transmissions that are about 1 mW. Thus, it is envisioned that low power frequencies will include the about one milliWatt range. Alternatively, a high power transmission would be considered to encompass the 800 mW utilized by cellular technology which might need FCC type acceptance. FIG. 6 further involves creating a combined set of data for all the utility monitors 612 and transmitting the combined set of data at the high power level to the utility data collection device. Thus, this embodiment of the invention is capable of utilizing low power transmitters which do not require FCC regulation; hence, the transmitters can be implemented much more readily than could be accomplished with transmitters that must meet FCC regulations. Furthermore, the fact that these transmitters are not required to meet FCC regulations, indicates that the power level is such that it would not significantly affect nearby residences.

Figure 7A:
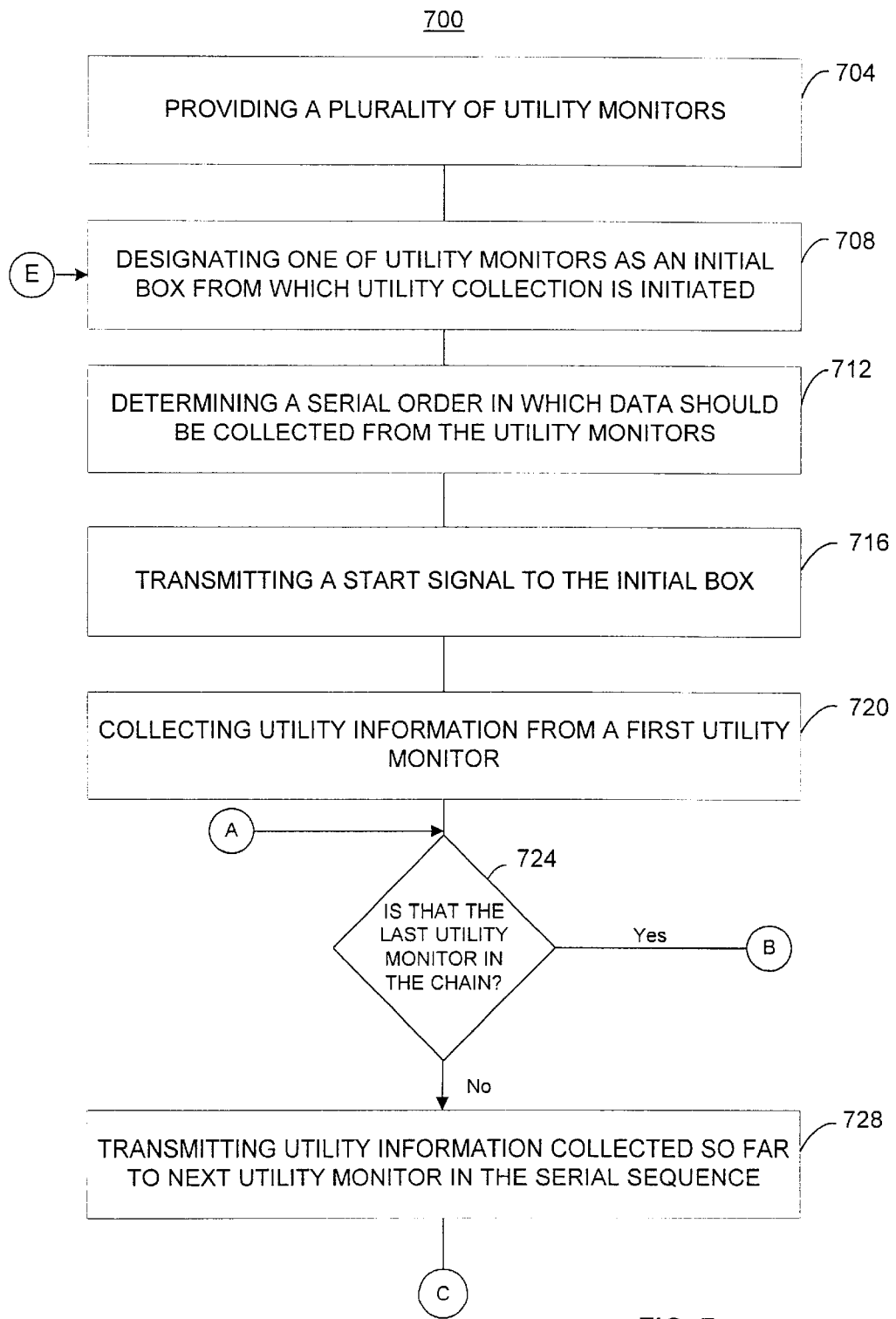
FIGS. 7A, 7B, and 7C illustrate another embodiment of the invention through a flow chart which demonstrates the gathering of utility data.
Figure 7B:
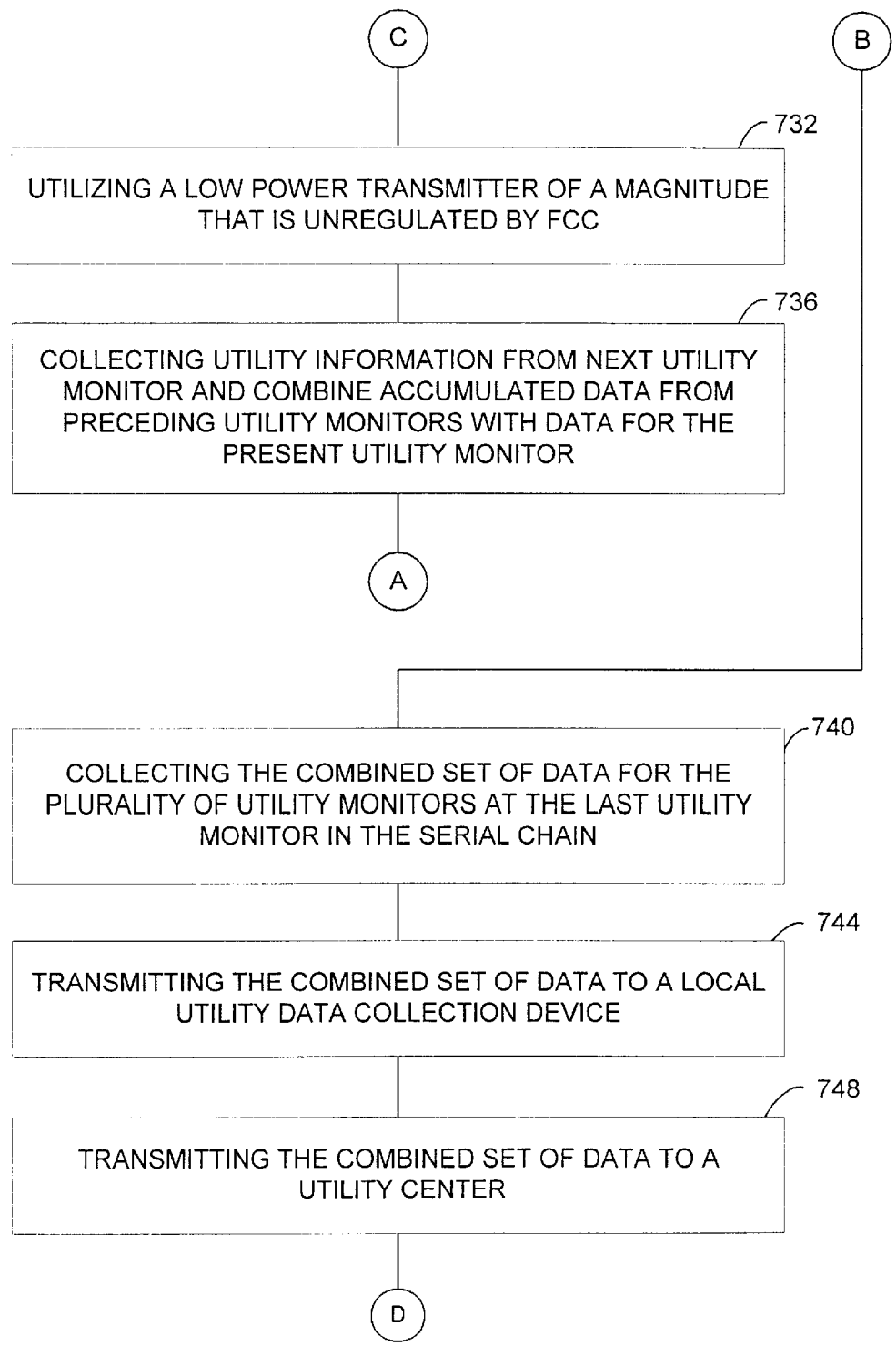
Figure 7C:
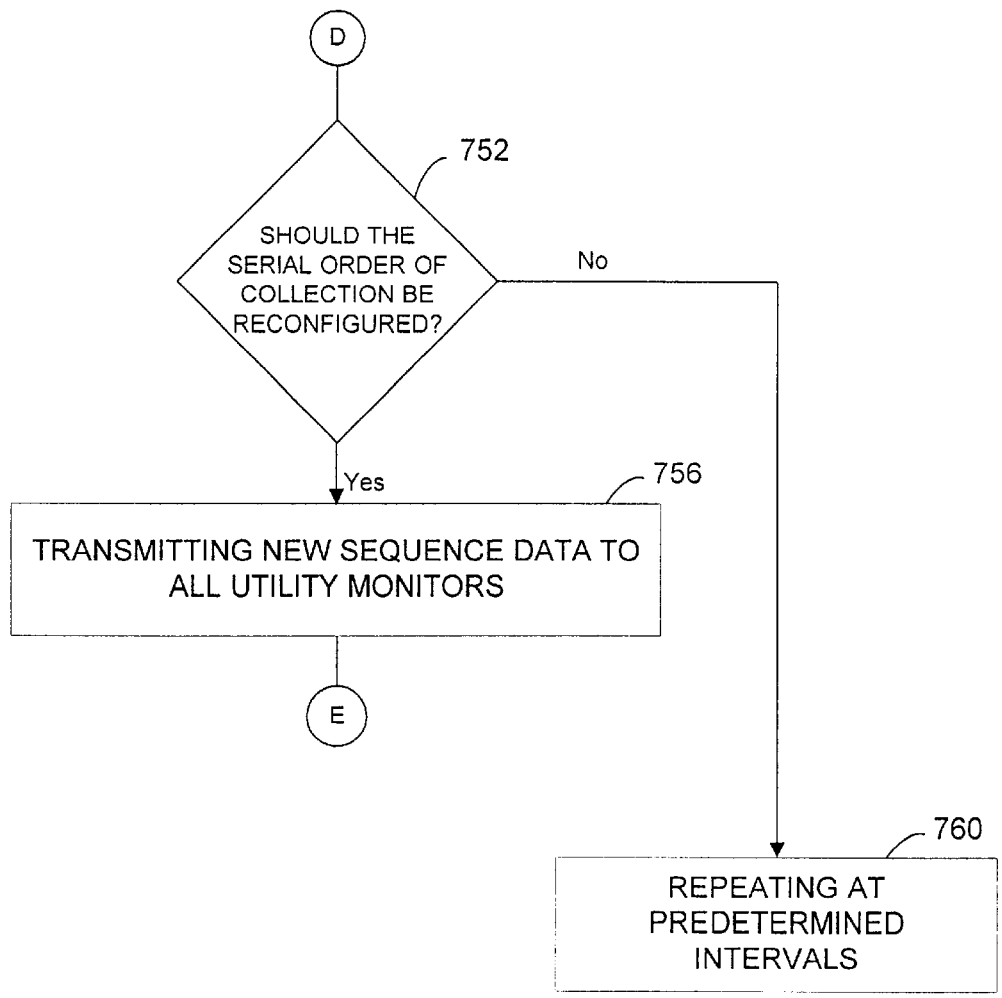

FIGS. 7A, 7B, and 7C illustrate a more detailed embodiment of the invention. In FIG. 7A, a plurality of utility monitors is provided in block 704. One of the utility monitors is designated as an "initial box" from which utility collection for a group of utility monitors is initiated 708. The designation of such a utility monitor as an initial box can be accomplished by the utility center or the utility data collection device, such as UDCD 104 in FIG. 1. The initial box will indicate the first utility monitor in the data gathering sequence for a group of utility monitors.

A serial order is determined in which data should be collected from the utility monitors 712. The serial order can be determined by the utility center or the utility collection device in each cell. The utility data collection device or the utility center will transmit the order to each individual utility monitor. In this manner, each utility monitor can store the serial sequence of the transmission sequence in its memory. Alternatively, each utility monitor could store its own address and the address to which it is required to transmit data. In this fashion, the utility center or utility data collection device is capable of reconfiguring the sequence in which utility monitors gather information. Furthermore, a malfunctioning utility monitor can be removed from the utility monitor data gathering sequence. The utility center or utility data collection data device is capable of initiating the data gathering process by transmitting a start or initiation signal to the utility monitor designated as the initial box 716. Thus, for example, a handshake arrangement can be utilized by the initial box with the utility data collection device so as to implement the data collection process. However, it is envisioned that only the initial box need be initiated as the subsequent utility monitors will be initiated through receipt of the preceding utility monitor's data.

Either before or after receipt of the start signal, the initial box collects utility information for its utility usage site 720. Thus, utility information for the gas utility, utility information for the water, utility and utility information for the electric utility, as well as any other required utilities at the first utility site can be gathered and stored at the first utility monitor.

A determination is made as to whether the present utility monitor is the last utility monitor in the chain 724. If it is not the last utility monitor in the chain, the collected utility information is transmitted to the next utility monitor in the serial sequence 728. Thus, the first utility monitor would transmit its information to the address of the second utility monitor. As explained earlier, a low power transmitter can be utilized that is unregulated by the FCC to transmit to the second utility monitor 732. The process repeats itself with the next successive utility monitor collecting utility information from its utility usage site and combining the accumulated data from the preceding utility monitor with data for the present utility monitor 736. As shown in FIGS. 7A and 7B, the process repeats itself testing whether the last utility monitor in the serial sequence has been arrived at. In 724, if the last utility monitor has been arrived at, the combined set of data for the plurality of utility monitors is collected at the last utility monitor in the serial chain 740. The combined set of data is transmitted to a local utility data collection device 744, such as UDCD 104 in FIG. 1. The combined set of data is received at the UDCD where it can be transmitted to the main utility center 748 utilizing a transmitter having a higher power level of transmission. Thus, the utility data collection device can reside in a remote cell of the utility system and still transmit a significant amount of data for the plurality of utility monitors to the utility center for processing. In this fashion, only a single high power level transmitter is needed for a significant number of utility monitors.

The gathering of utility data information can occur at any predetermined time period. Through trial and error, the utility center can determine a preferred order of collecting data from utility monitors in the field. Thus, a determination can be made as to whether the order of collection should be reconfigured 752. If such a determination is made that the serial order should be reconfigured, a new serial sequence can be transmitted to all utility monitors in the sequence 756. Then the process can repeat itself with the designation of one of the utility monitors as the initial box from which utility data collection is initiated 708. The reconfiguration of the serial sequence also permits removing a utility monitor from the sequence by omitting its address from the serial sequence. However, if the serial sequence is acceptable, the data gathering process can be repeated at predetermined intervals 760. Typically, one could envision that a data collection cycle would be initiated at a predetermined time during each day. Furthermore, this would allow reducing the power in the utility monitors until a predetermined time during the day at which point they could be fully awakened and utilized to transmit data to the next successive utility monitor. This would reduce the amount of power required to power the utility monitors during the day.

Figure 8:
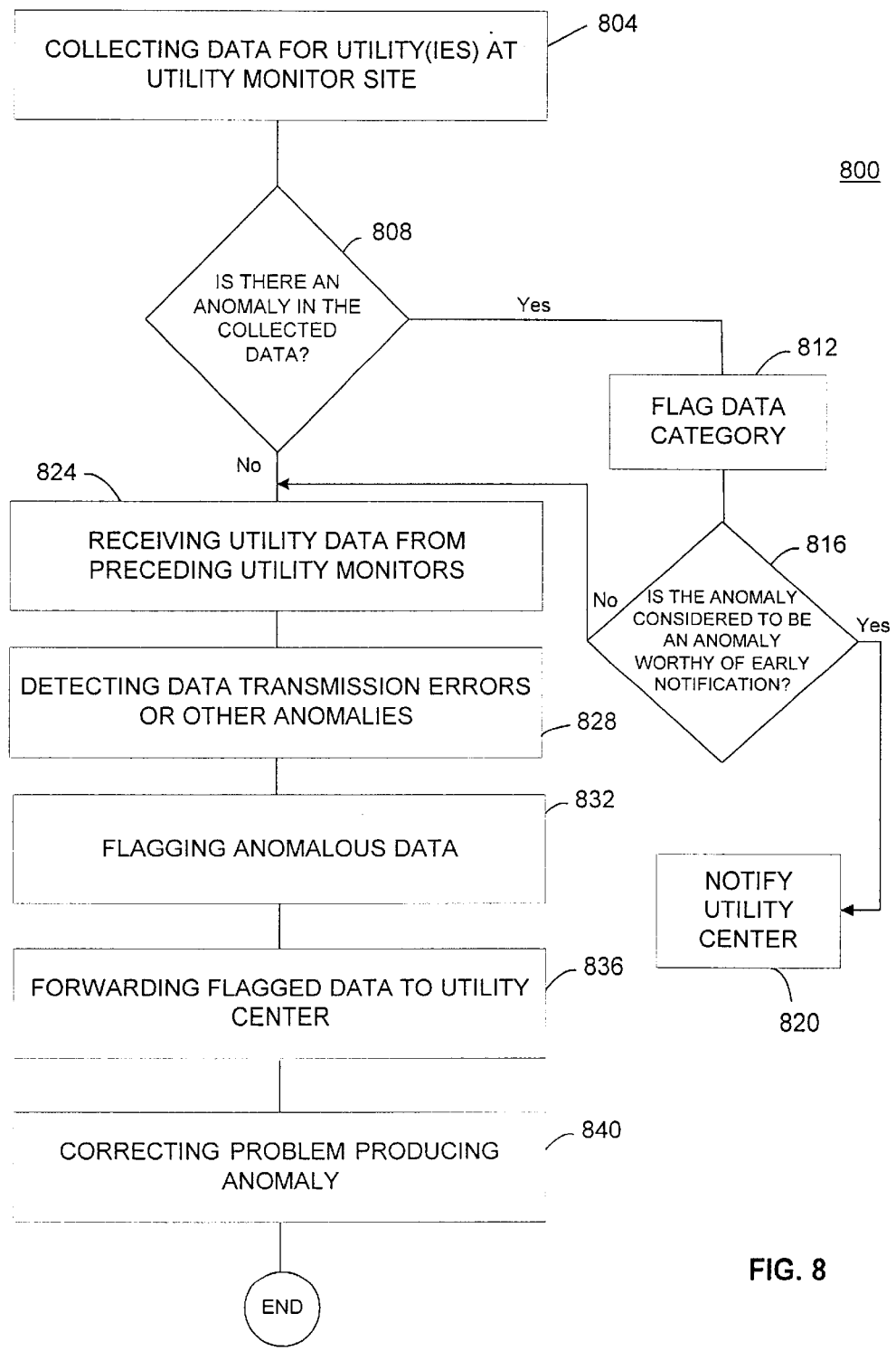
FIG. 8 illustrates yet another embodiment of the invention for detecting error information and relaying that information to a utility center.

FIG. 8 illustrates an embodiment of the invention that allows tracking of errors that occur at utility usage site where a utility monitor is located. In method 800, data for utilities at a utility monitor site is collected 804. A determination is made as to whether there is an anomaly in the collected data 808. For example, if there is an indication that there is an overvoltage or undervoltage or no indication of usage when one would be expected. If there is an anomaly, that data category is flagged 812. For example, one might categorize four different categories for electrical service: overvoltage, undervoltage, current surges, or noisy power, e.g., intermittent power surges. This data or each individual category could correspond to a flag represented digitally in memory. Furthermore, a determination can be made as to whether the anomaly is considered worthy of early notification 816. Thus, if each category corresponding to a flag also has a level of seriousness, serious anomalies can be forwarded immediately or at an earlier time to the utility data collection device or utility center 820. If the anomaly is not considered to be serious, the flagged information can simply be stored for later transmission to the utility center. As the gathering of utility data continues, data is transmitted to successive utility monitors as was explained in regard to FIG. 1. Thus, successive utility monitors receive utility data from preceding utility monitors 824. During the receipt of utility data, transmission errors can be detected or anomalies can be noted 828. Thus, the utility monitors serve as a first check of the utility monitor data received from preceding utility monitors. If such an error, such as a transmission error is received, the data can be flagged as anomalous data 832. Thus, if the utility monitor data for utility monitor #1 was originally gathered without any indication that anomalous data existed; yet, during transmission to utility monitor #2 a corruption of the signal corrupted the data for utility monitor #1, utility monitor #2 can reflect the potential anomalous data by changing the flag information for utility monitor #1. Once the data is gathered for the utility monitor, or the utility data as well as flagged data is forwarded to the utility center 836. At the utility center, the utility data can be analyzed and steps can be taken to correct the problem producing the anomaly 840.

Figure 9:
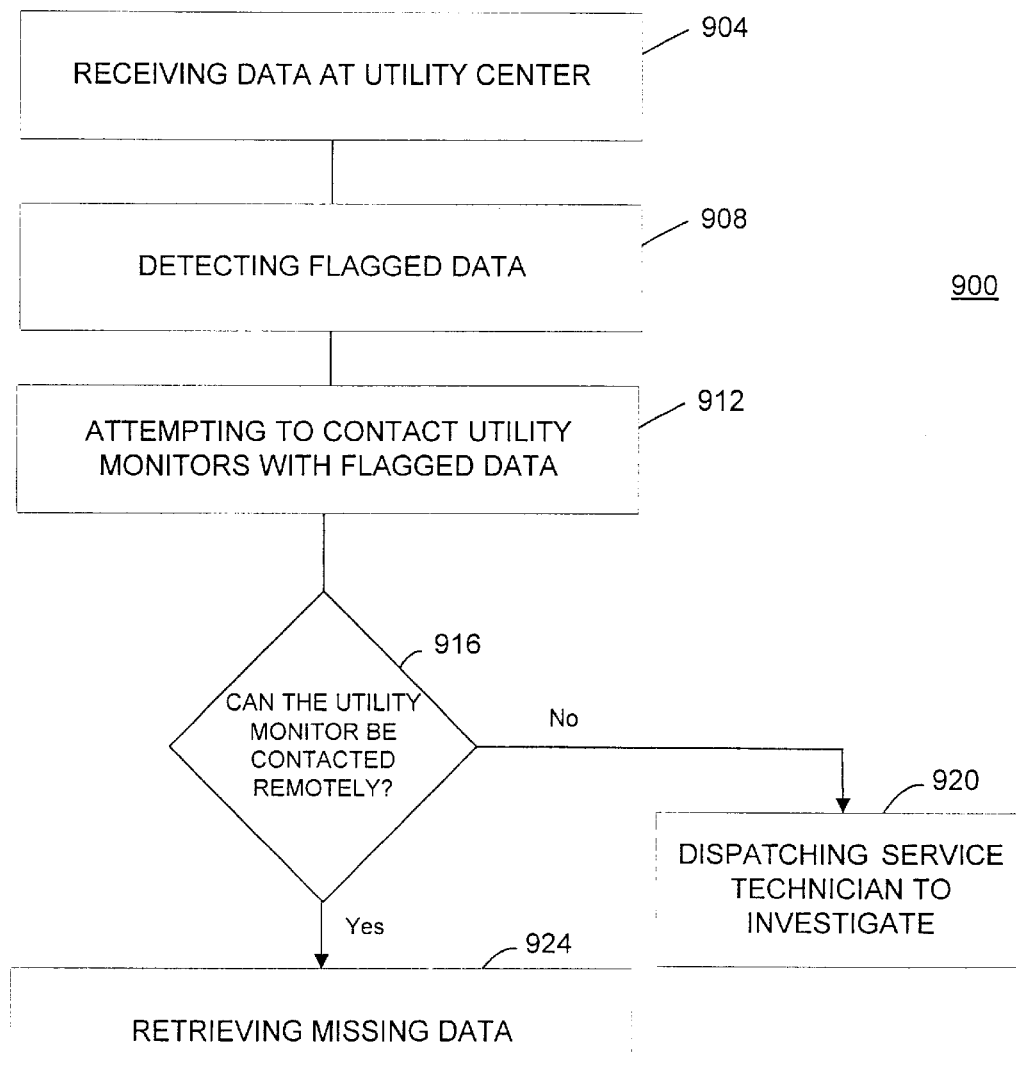
FIG. 9 illustrates a flow chart for an embodiment of the invention in which missing data is retrieved by the utility center.

FIG. 9 illustrates an embodiment of the invention in which a method 900 can be used to correct problems producing anomalies at the utility monitors. The utility center receives the utility data for the plurality of utility monitors 904. The utility center reviews the data retrieved for the utility monitors and notes any flagged data categories. By comparing the retrieved flagged data to historical data or expected data, the utility center can detect whether the flagged data is anomalous 908. Assuming that the flagged data is incorrect, the utility center can attempt to contact the individual utility monitor directly 912. One embodiment of the invention allows a high power transmitter/receiver to be located at each utility monitor. Thus, a cellular type circuit, for example, could be located at each utility monitor with which the utility center can couple. Thus, the utility center can directly couple to each individual utility monitor in the field. If the utility monitor can be contacted remotely by either the utility center or the data collection device 916, then an attempt can be made to retrieve missing data 924, such as data that was corrupted during the serial transmission sequence. However, if the utility monitor can not be contacted remotely, a service technician can be dispatched to investigate further 920.

While various embodiments of the invention have been described as methods or apparatus for implementing the invention. It should be understood that the invention can be implemented through code coupled to a computer, e.g., code resident on a computer or accessible by the computer. For example, each utility monitor could contain a computer usable medium on which code operable to implement the functions performed by the utility monitor is stored. Similarly, the utility data collection device could also be comprised of a computer usable medium on which code operable to implement its functions is stored. Software and databases could be utilized to implement some embodiments of the methods discussed above. Thus, in addition to embodiments where the invention is accomplished by hardware, it is also noted that some of these embodiments can be accomplished through the use of an article of manufacture comprised of a computer usable medium having a computer readable program code embodied therein, which causes the enablement of the functions disclosed in this description. Therefore, it is desired that the embodiments expressed above also be considered protected by this patent in their program code means as well.

For example, this might be accomplished through the use of hardware description language (HDL), register transfer language (RTL), VERILOG, VHDL, or similar programming tools, as one of ordinary skill in the art would understand. The book "A Verilog HDL Primer" by J. Bhasker, Star Galaxy Pr., 1997 provides greater detail on Verilog and HDL and is hereby incorporated by reference for all that it discloses for all purposes. It is therefore envisioned that the functions accomplished by the present invention as described above could be represented in a core which could be utilized in programming code and transformed to hardware as part of the production of integrated circuits. Therefore, it is desired that such embodiments also be considered protected by this patent in their program code means as well.

It is also envisioned that embodiments of the invention could be accomplished as computer signals embodied in a carrier wave, as well as data signals propagated through a transmission medium, e.g., electrical signals transmitted across a wire or optical signals across a fiber optic cable. Thus, the various information discussed above could be formatted in a structure, such as a data structure, and transmitted as an electrical signal through a transmission medium.

It is also noted that many of the structures and acts recited herein can be recited as means for performing a function or steps for performing a function, respectively. Therefore, it should be understood that such language is entitled to cover all such structures or acts disclosed within this specification and their equivalents, including the matter incorporated by reference.

It is thought that the apparatuses and methods of the embodiments of the present invention and many of its attendant advantages will be understood from this specification and it will be apparent that various changes may be made in the form, construction and arrangement of the parts thereof without departing from the spirit and scope of the invention or sacrificing all of its material advantages, the form herein before described being merely exemplary embodiments thereof.

What is claimed is:

1. A method of collecting utility data for a utility system, said utility system comprising a plurality of utility usage sites located remotely from a data collection device, said method comprising:

providing a first utility monitor located at a first utility usage site;

receiving data from a second utility monitor located at a second utility usage site;

combining said data from said second utility monitor with data from said first utility monitor so as to form a combined set of data;

transmitting said combined set of data to said data collection device;

designating one of a plurality of utility monitors as an initial utility monitor from which a data collection cycle is initiated.

2. The method as described in claim 1 and further comprising programming one of said plurality of utility monitors with a serial sequence in which data is collected from said plurality of utility monitors.

3. The method as described in claim 2 and further comprising remotely altering said serial sequence stored at said initial utililty monitor.

4. The method as described in claim 2 and further comprising serially transmitting data between said plurality of utility monitors in said serial sequence so as to collect data for said plurality of utility usage sites.

5. The method as described in claim 4 and further comprising transmitting said data for said plurality of utility usage sites to said data collection device at a power level of less than about 800 milliwatts.

6. The method as described in claim 1 and further comprising collecting a combined set of data for said plurality of utility monitors at an end box of said plurality of utility monitors.

7. The method as described in claim 6 and further comprising analyzing said combined set of data so as to determine that at least one of said plurality of utility monitors requires maintenance.

8. The method as described in claim 7 and further comprising directly connecting to said at least one utility monitor requiring maintenance.

9. The method as described in claim 8 wherein said directly connecting comprises telephoning the at least one utility monitor requiring maintenance.

10. A method of collecting utility information, said method comprising:

providing a plurality of utility monitors, each of said utility monitors located at a utility usage site;

designating one of said plurality of utility monitors as an initial box from which a data collection cycle is initiated;

determining a serial order in which data should be collected from said plurality of utility monitors;

collecting utility information for a utility usage site where said initial box is located;

transmitting said utility information collected for said initial box to another of said utility monitors;

serially transmitting data between each of said plurality of utility monitors so as to create a combined set of data for said plurality of utility monitors;

utilizing a low power transmission between each of said plurality of utility monitors such that the power of said low power transmission is of a magnitude that is unregulated by the FCC;

collecting a combined set of data for said plurality of utility monitors at an end box of said plurality of utility monitors;

transmitting said combined set of data to a utility data collection device;

remotely altering said serial order from a remote control center.

11. A method of collecting utility information, said method comprising:

providing a plurality of utility monitors, each of said utility monitors located at a utility usage site;

designating one of said plurality of utility monitors as an initial box from which a data collection cycle is initiated;

determining a serial order in which data should be collected from said plurality of utility monitors;

collecting utility information for a utility usage site where said initial box is located;

transmitting said utility information collected for said initial box to another of said utility monitors;

serially transmitting data between each of said plurality of utility monitors so as to create a combined set of data for said plurality of utility monitors;

utilizing a low power transmission between each of said plurality of utility monitors such that the power of said low power transmission is of a magnitude that is unregulated by the FCC;

collecting a combined set of data for said plurality of utility monitors at an end box of said plurality of utility monitors;

transmitting said combined set of data to a utility data collection device;

revising said serial order so as to eliminate one of said plurality of utility monitors from said serial order.

* * * * *